US012720699B2

(12) United States Patent
Chien

(10) Patent No.: US 12,720,699 B2
(45) Date of Patent: Aug. 25, 2026

(54) PROTECTION CAPS FOR INTERFACE CONNECTOR OF A GRAPHICS PROCESSING UNIT BOARD

(71) Applicant: DELL PRODUCTS L.P., Round Rock, TX (US)

(72) Inventor: Tung-Yu Chien, New Taipei City (TW)

(73) Assignee: Dell Products L.P., Round Rock, TX (US)

(*) Notice: Subject to any disclaimer, the term of this patent is extended or adjusted under 35 U.S.C. 154(b) by 240 days.

(21) Appl. No.: 18/641,619

(22) Filed: Apr. 22, 2024

(65) Prior Publication Data

US 2025/0331115 A1 Oct. 23, 2025

(51) Int. Cl.
*H05K 7/14* (2006.01)
*G06F 1/183* (2026.01)

(52) U.S. Cl.
CPC .......... *H05K 7/1402* (2013.01); *G06F 1/183* (2013.01)

(58) Field of Classification Search
CPC .............................. H05K 7/1402; G06F 1/183
USPC ......................................... 361/801, 803, 759
See application file for complete search history.

(56) References Cited

U.S. PATENT DOCUMENTS 5,591,050 A * 1/1997 Sueoka .............. H01R 13/6594 439/607.28
6,857,912 B2 * 2/2005 Wu .................... H01R 13/6587 439/701
9,313,913 B2 4/2016 Jimenez, III et al.
11,547,011 B2 1/2023 Teeter et al.
2012/0077385 A1 * 3/2012 Qiao ...................... H01R 24/62 439/628
2014/0065887 A1 * 3/2014 Kida ...................... H01R 13/46 439/629
2015/0349439 A1 * 12/2015 Sawairi ................ H01R 12/596 439/573

* cited by examiner

*Primary Examiner* — Hung S. Bui
(74) *Attorney, Agent, or Firm* — Larson Newman, LLP

(57) ABSTRACT

A protective cap component includes first and second interface connector protective components and a coupling component. Both of the first and second interface connector protective component include side panels, a top panel, a bottom panel, and an extension tab. The top panel of each interface connector protective component is located between respective top edges of the side panels and extends perpendicular to the first and second side panels. The bottom panel of each interface connector protective component is located between respective bottom edges of the side panels and extends perpendicular to the side panels. The extension tab of each interface connector protective component extends from the respective bottom panel. The coupling component is in physical communication with and located between the first and second interface connector protective components.

20 Claims, 6 Drawing Sheets

PROTECTION CAPS FOR INTERFACE CONNECTOR OF A GRAPHICS PROCESSING UNIT BOARD

FIELD OF THE DISCLOSURE

The present disclosure generally relates to information handling systems, and more particularly relates to protection caps for an interface connector of a graphics processing unit board.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A protective cap component includes first and second interface connector protective components and a coupling component. Both of the first and second interface connector protective component include side panels, a top panel, a bottom panel, and an extension tab. The top panel of each interface connector protective component is located between respective top edges of the side panels and extends perpendicular to the first and second side panels. The bottom panel of each interface connector protective component is located between respective bottom edges of the side panels and extends perpendicular to the side panels. The extension tab of each interface connector protective component extends from the respective bottom panel. The coupling component is in physical communication with and located between the first and second interface connector protective components.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
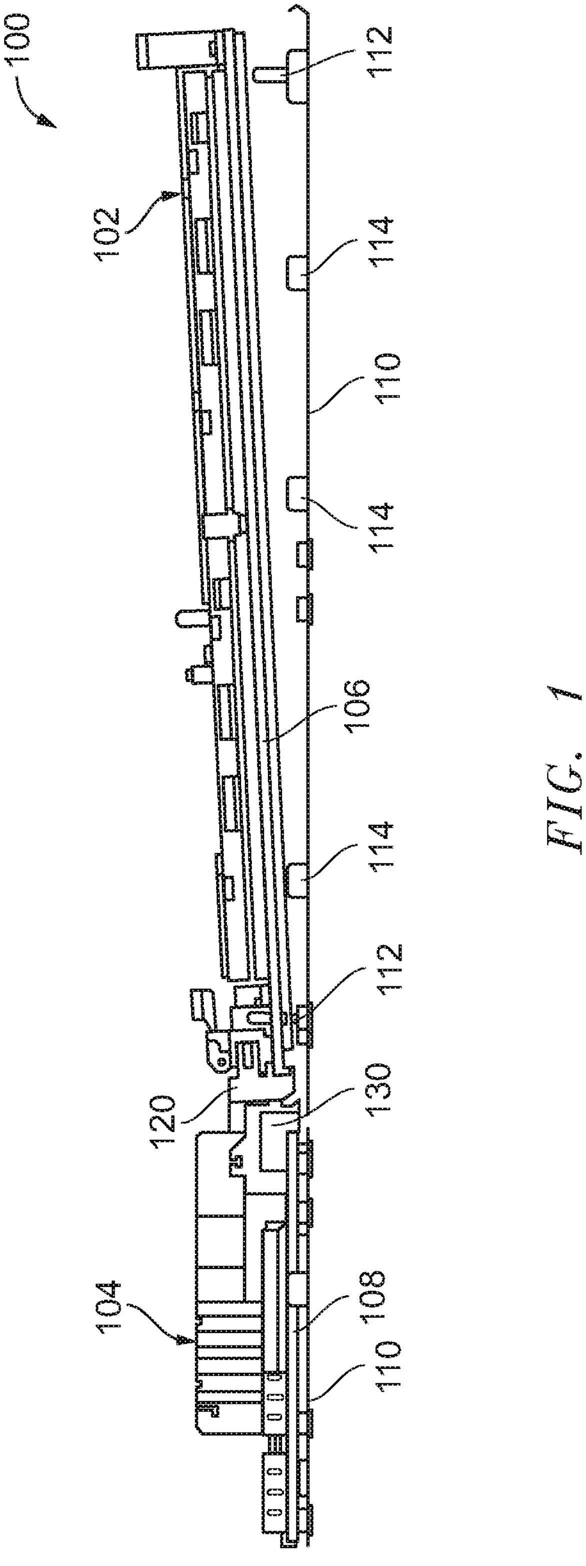
FIGS. 1 and 2 are diagrams of a graphics processing unit board interfacing with a backplane board of an information handling system according to at least one embodiment of the present disclosure.
Figure 2:
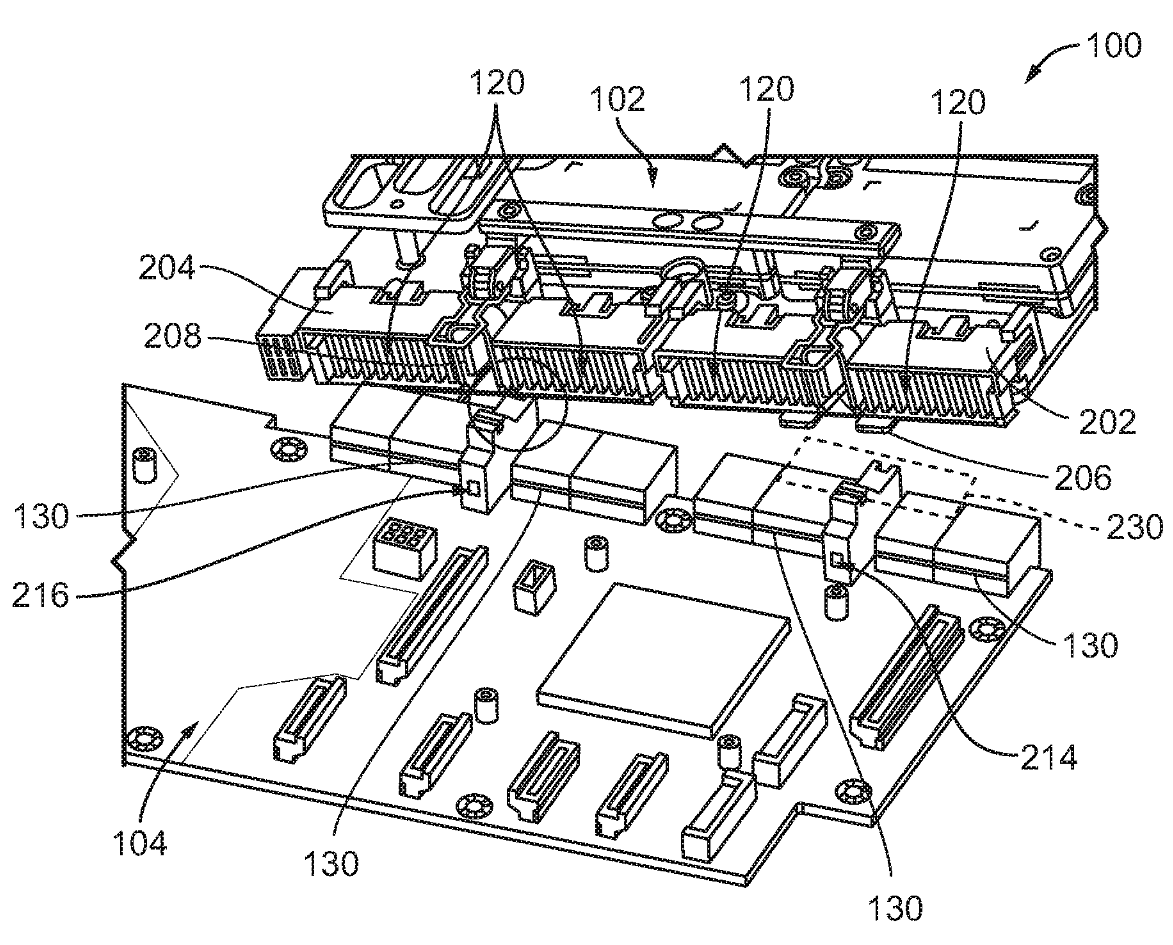

FIGS. 1 and 2 illustrate a portion of an information handling system 100 including a graphics processing unit (GPU) node 102 and a backplane 104 according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Referring now to FIG. 1, information handling system 100 further includes a GPU base printed circuit board (PCB) 106, a backplane board 108, a support tray 110, alignment posts 112, and supports 114. GPU node 102 includes GPU base PCB 106, which in turn includes interface connectors 120. Backplane 104 includes backplane board 108, which in turn includes connectors 130. In an example, GPU node 102 may be referred to as an information handling system without varying from the scope of this disclosure. While GPU node 102 is described herein, any other type of information handling system or node may include and utilize interface connectors 120 without varying from the scope of this disclosure. Information handling system 100 may include additional components without varying from the scope of this disclosure.

In an example, backplane 104 may be securely mounted within information handling system 100, such that backplane board 108 is securely connected to support tray 110. In certain examples, GPU node 102 may be inserted within information handling system 100 to connect and communicate with backplane 104. In an example, GPU node 102 may be inserted within information handling system 100 at an angle such that the first interaction between interface connectors 120 of GPU node 102 and connectors 130 of backplane 104 may be at an angle as illustrated in FIG. 1. As GPU node 102 is lowered into information handling system 100, alignment posts 112 may be inserted into and through GPU base PCB 106 to provide a proper distance between interface connectors 120 of the GPU node and connectors 130 of backplane 104. When GPU node 102 is fully inserted within information handling system 100, GPU base PCB 106 may rest on supports 114 so that interface connectors 120 may be properly aligned with connectors 130.

Referring now to FIG. 2, information handling system 100 further includes protective cap components 202 and 204, alignment posts 206 and 208, and guide sockets 214 and 216. In an example, GPU node 102 may include multiple interface connectors 120. For example, GPU node 102 may include four interface connectors 120 as shown in FIG. 2, and the interface connectors may be located along one side of GPU base PCB 106. In this example, interface connectors 120 may be arranged in pairs and each pair may have one of alignment posts 206 and 208 between each interface connector of the pair. In certain examples, protective cap component 202 may slide over and snap fit onto one of the pairs of interface connectors 120 and protective cap component 204 may slide over and snap fit onto the other pair of interface connectors.

In an example, backplane 106 may include four connectors 130 as shown in FIG. 2, and the connectors may be located along one side of backplane board 108. In certain examples, connectors 130 may be arranged in pairs and each pair may have one of guide socket 212 and 214 between each connector of the pair. In an example, alignment post 206 may be inserted into guide socket 212 and alignment post 206 may be inserted into guide socket 214 to provide proper alignment between GPU node 102 and backplane 104. A portion 230 of connectors 130 and guide socket 214 will be described with respect to FIG. 3 below.

Figure 3:
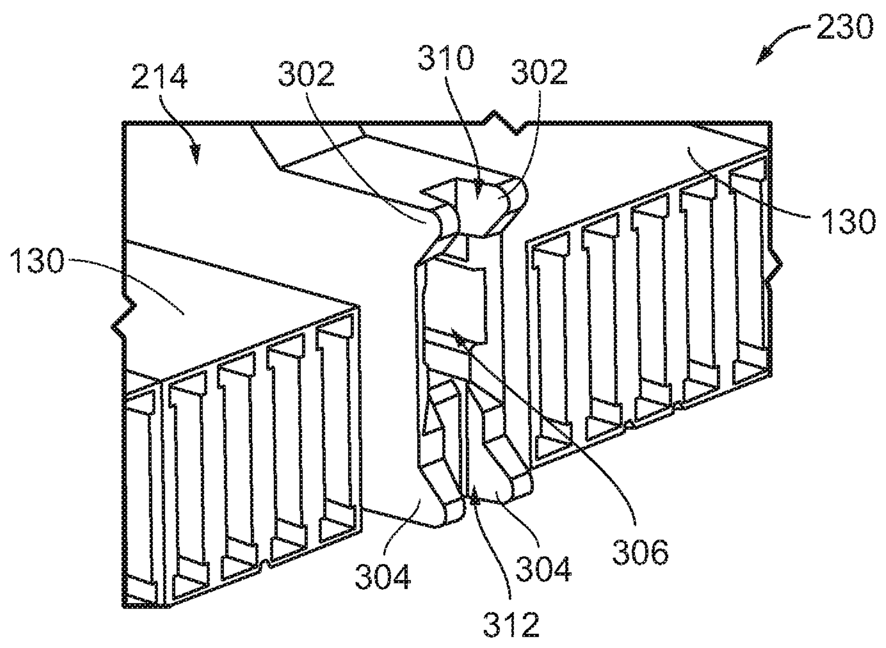
FIG. 3 is a perspective view of a guide socket and backplane connectors according to at least one embodiment of the present disclosure.

FIG. 3 illustrates portion 230 of connectors 130 and guide socket 214 according to at least one embodiment of the present disclosure. Guide socket 214 includes a top fork feature 302 and a bottom fork feature 304, and an alignment channel 306. In an example, top fork feature 302 includes a slot 310, and bottom fork feature 304 includes a slot 312. While only guide socket 214 is described herein, guide socket 216 may be substantially similar to guide socket 214. Guide socket 214 may include additional components without varying from the scope of this disclosure.

In an example, alignment channel 306 may be configured to receive alignment post 204 of GPU node 102 shown in FIG. 2. When alignment post 204, shown in FIG. 2, is inserted within alignment channel 306 interface connectors 120 of GPU node 102 may be properly aligned with connectors 130 of backplane 104 shown in FIG. 2. In certain examples, slot 310 of fork feature 302 may create two separate alignment features. Similarly, slot 312 of fork feature 304 may create two separate alignment features. In an example, fork features 302 and 304 may taper downward toward the center of guide socket 214. In this example, the shape of fork features 302 and 304 may adjust GPU node 102 of FIG. 2 up/down to align interface connectors 120 with connectors 130 as shown in FIG. 2.

Figures 4, 5:
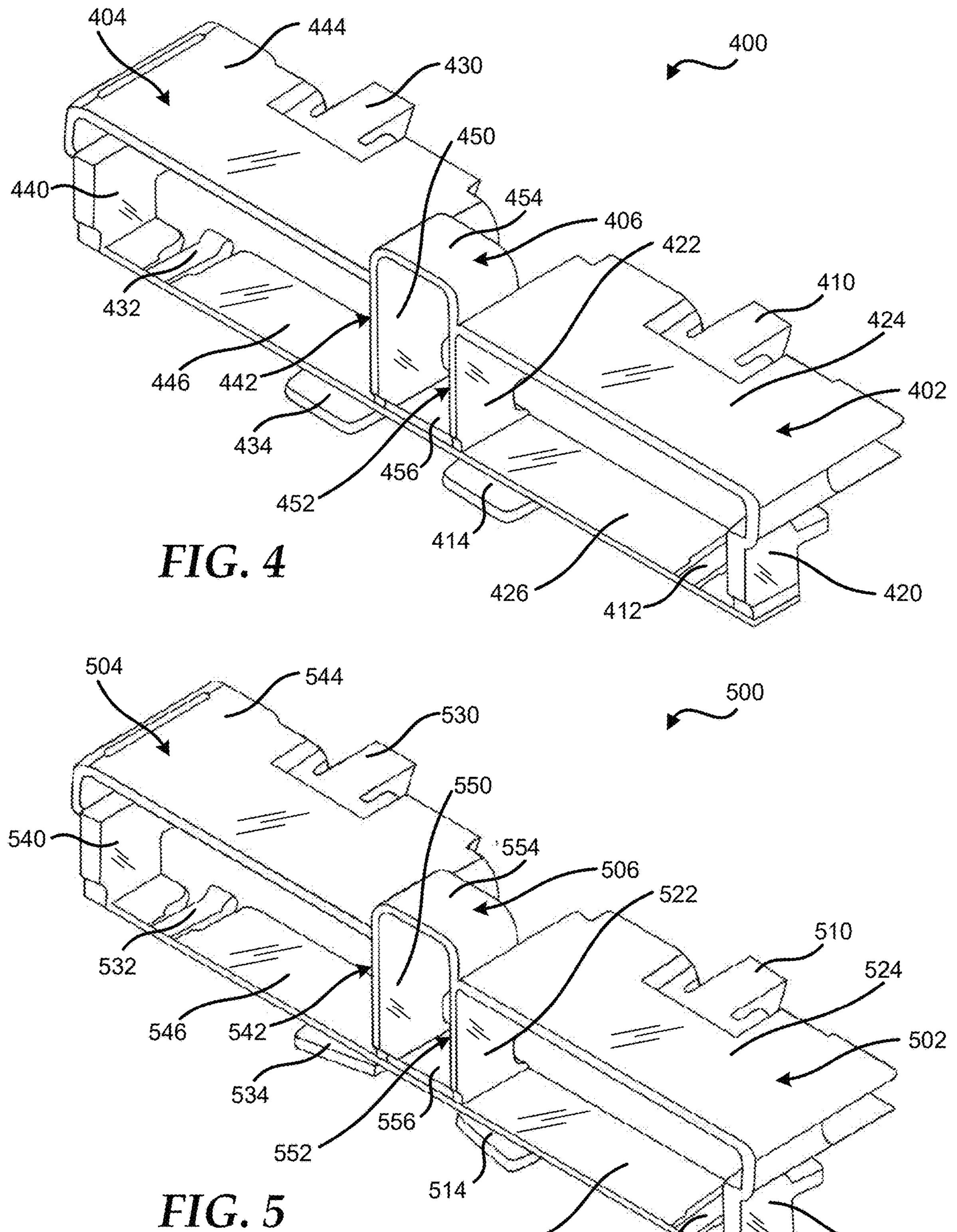
FIGS. 4 and 5 are perspective views of different embodiments of a protection cap according to at least one embodiment of the present disclosure.

FIG. 4 illustrates an embodiment of a protection cap component 400 according to at least one embodiment of the present disclosure. Protection cap component 400 is substantially similar to protection cap components 202 and 204 of FIG. 2. Protection cap component 400 includes interface connector protective components 402 and 404 and a coupling component 406. Protection cap component 400 may include additional components without varying from the scope of this disclosure.

In an example, interface connector protective component 402 includes snap lock components 410 and 412, an extension tab 414, side panels 420 and 422, a top panel 424, and a bottom panel 426. Snap lock component 410 may extend from the back of top panel 424, and snap lock component 412 may extend from the back of bottom panel 426. In certain examples, when protection cap component 400 slides over a pair of interface connectors, such as interface connectors 120 in FIG. 2, snap lock components 410 and 412 may secure the protection cap component on the interface connectors. For example, snap lock components 410 and 412 may flex away from the interface connectors as protection cap component 400 slides onto the interface connectors and then a hook portion of each of the snap lock components snap may snap lock onto the back of the interface connector.

In certain examples, top panel 424 may be located between top edges of side panels 420 and 422 and extend perpendicularly between side panels 420 and 422. In certain examples, bottom panel 426 may be located between bottom edges of side panels 420 and 422 and extend perpendicularly between side panels 420 and 422. In an example, extension tab 414 may be in physical communication with bottom panel 426 and may extend from the bottom panel. In certain examples, extension tab 414 may be located at the intersection of the bottom panel and coupling component 404. In an example, extension tab 414 may be any suitable shape, such as a rectangular shape as shown in FIG. 4. When protection cap component 400 is connected to interface connector 120, front edges of side panels 420 and 422, top panel 424, and bottom panel 426 may extend beyond interface connector 120 as illustrated in FIG. 2.

In an example, interface connector protective component 404 includes snap lock components 430 and 432, an extension tab 434, side panels 440 and 442, a top panel 444, and a bottom panel 446. Snap lock component 430 may extend from the back of top panel 444, and snap lock component 432 may extend from the back of bottom panel 446. In certain examples, when protection cap component 400 slides over a pair of interface connectors, such as interface connectors 120 in FIG. 2, snap lock components 430 and 432 may secure the protection cap component on the interface connectors. For example, snap lock components 430 and 432 may flex away from the interface connectors as protection cap component 400 slides onto the interface connectors and then a hook portion of each of the snap lock components snap may snap lock onto the back of the interface connector.

In certain examples, top panel 444 may be located between top edges of side panels 440 and 442 and extend perpendicularly between side panels 440 and 442. In certain examples, bottom panel 446 may be located between bottom edges of side panels 440 and 442 and extend perpendicularly between side panels 440 and 442. In an example, extension tab 434 may be in physical communication with bottom panel 446 and may extend from the bottom panel. In certain examples, extension tab 434 may be located at the intersection of the bottom panel and coupling component 404. In an example, extension tab 434 may be any suitable shape, such as a rectangular shape as shown in FIG. 4. When protection cap component 400 is connected to interface connector 120, front edges of side panels 440 and 442, top panel 444, and bottom panel 446 may extend beyond interface connector 120 as illustrated in FIG. 2.

In an example, coupling component 406 includes edge surfaces 450 and 452 and a top panel 454. In certain examples, edge surface 450 is in physical communication with side panel 442 of interface connector protective component 404 and edge surface 452 is in physical communication with side panel 432 of interface connector protective component 402. In an example, when protection cap component 400 is connected to interface connector 120, alignment post 206 may extend through coupling component 406 as illustrated in FIG. 2.

FIG. 5 illustrates an embodiment of a protection cap component 500 according to at least one embodiment of the present disclosure. Protection cap component 500 is substantially similar to protection cap components 202 and 204 of FIG. 2. Protection cap component 500 includes interface connector protective components 502 and 504 and a coupling component 506. Protection cap component 500 may include additional components without varying from the scope of this disclosure.

In an example, interface connector protective component 502 includes snap lock components 510 and 512, an extension tab 514, side panels 520 and 522, a top panel 524, and a bottom panel 526. Snap lock component 510 may extend from the back of top panel 524, and snap lock component 512 may extend from the back of bottom panel 526. In certain examples, when protection cap component 500 slides over a pair of interface connectors, such as interface connectors 120 in FIG. 2, snap lock components 510 and 512 may secure the protection cap component on the interface connectors. For example, snap lock components 510 and 512 may flex away from the interface connectors as protection cap component 500 slides onto the interface connectors and then a hook portion of each of the snap lock components snap may snap lock onto the back of the interface connector.

In certain examples, top panel 524 may be located between top edges of side panels 520 and 522 and extend perpendicularly between side panels 520 and 522. In certain examples, bottom panel 526 may be located between bottom edges of side panels 520 and 522 and extend perpendicularly between side panels 520 and 522. In an example, extension tab 514 may be in physical communication with bottom panel 526 and may extend from the bottom panel. In certain examples, extension tab 514 may be located at the intersection of the bottom panel and coupling component 504. In an example, extension tab 514 may be any suitable shape, such as a triangular shape as shown in FIG. 5. In this example, extension tab 514 may taper downward in the direction of coupling component 506. When protection cap component 500 is connected to interface connector 120, front edges of side panels 520 and 522, top panel 524, and bottom panel 526 may extend beyond interface connector 120 as illustrated in FIG. 2.

In an example, interface connector protective component 504 includes snap lock components 530 and 532, an extension tab 534, side panels 540 and 542, a top panel 544, and a bottom panel 546. Snap lock component 530 may extend from the back of top panel 544, and snap lock component 532 may extend from the back of bottom panel 546. In certain examples, when protection cap component 500 slides over a pair of interface connectors, such as interface connectors 120 in FIG. 2, snap lock components 530 and 532 may secure the protection cap component on the interface connectors. For example, snap lock components 530 and 532 may flex away from the interface connectors as protection cap component 500 slides onto the interface connectors and then a hook portion of each of the snap lock components snap may snap lock onto the back of the interface connector.

In certain examples, top panel 544 may be located between top edges of side panels 540 and 542 and extend perpendicularly between side panels 540 and 542. In certain examples, bottom panel 546 may be located between bottom edges of side panels 540 and 542 and extend perpendicularly between side panels 540 and 542. In an example, extension tab 534 may be in physical communication with bottom panel 546 and may extend from the bottom panel. In certain examples, extension tab 534 may be located at the intersection of the bottom panel and coupling component 504. In an example, extension tab 514 may be any suitable shape, such as a triangular shape as shown in FIG. 5. In this example, extension tab 514 may taper downward in the direction of coupling component 506. When protection cap component 500 is connected to interface connector 120, front edges of side panels 540 and 542, top panel 544, and bottom panel 546 may extend beyond interface connector 120 as illustrated in FIG. 2.

In an example, coupling component 506 includes edge surfaces 550 and 552 and a top panel 554. In certain examples, edge surface 550 is in physical communication with side panel 542 of interface connector protective component 504 and edge surface 552 is in physical communication with side panel 532 of interface connector protective component 502. In an example, when protection cap component 500 is connected to interface connector 120, alignment post 206 may extend through coupling component 506 as illustrated in FIG. 2.

Figure 6:
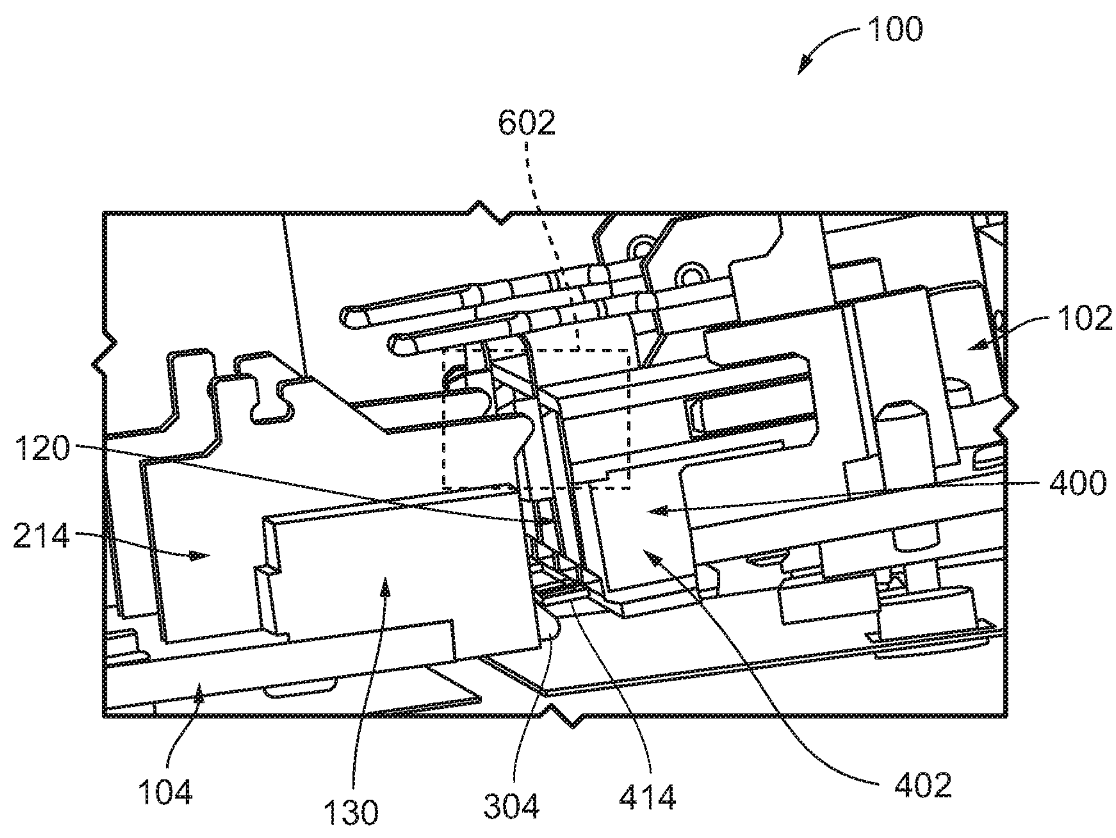
FIGS. 6 and 7 are perspective views of the interface between a guide socket and a protection cap according to at least one embodiment of the present disclosure.
Figure 7:
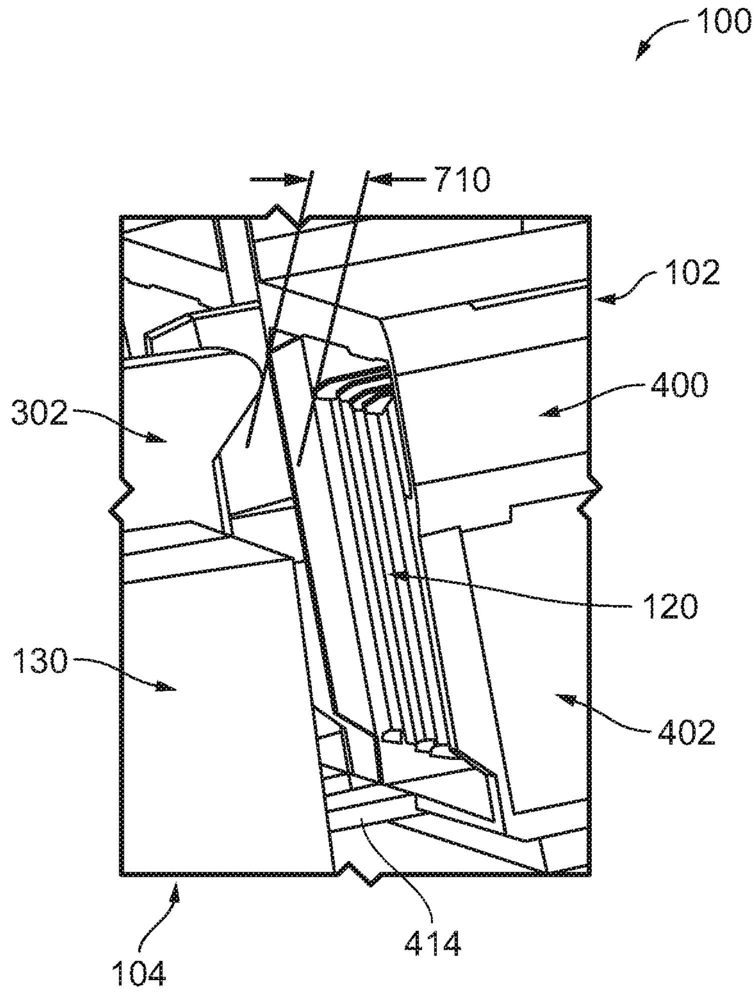

FIGS. 6 and 7 illustrate GPU node 102 and backplane 104 according to at least one embodiment of the present disclosure. GPU node 102 includes interface connector 120 and protection cap component 400, which in turn includes interface connector protective component 402. Backplane 104 includes connector 130 and guide socket 214. While FIGS. 6 and 7 illustrate additional components of GPU node 102 and backplane 104, for clarity and brevity only a few of the components have been labeled and referenced with respect to FIGS. 6 and 7.

As GPU node 102 is pushed closer to backplane 104, protection cap component 400 and guide socket 214 may be the first components to possibly be placed in physical communication with one another. In an example, GPU plane 102 may be misaligned with backplane 104. In this example, interface connector 120 may not properly connect with connector 130. Instead, extension tab 414 may be placed in physical communication with guide socket 214. When guide socket 214 hits extension tab 414, the physical communication between the guide socket and the extension tab will prevent any portion of interface connector 120 from hitting connector 130. Instead, a gap of a particular distance will remain between interface connector 120 and guide socket 214 as illustrated in portion 602 as shown in FIG. 7.

Referring now to FIG. 7, portion 602 illustrates a gap 702 between guide socket 214 and interface connector 120. In an example, a distance of gap 702 may be any suitable distance that will prevent guide socket 214 from hitting and possibly damaging interface connector 120. As stated above, the distance of gap 702 is created when guide socket 214 is placed in physical communication with extension tab 414. Thus, the combination of guide socket 214 and extension tab 414 may prevent additional damage of interface connector 120 over the protection provided by protection cap component 400 without the extension tab.

Figure 8:
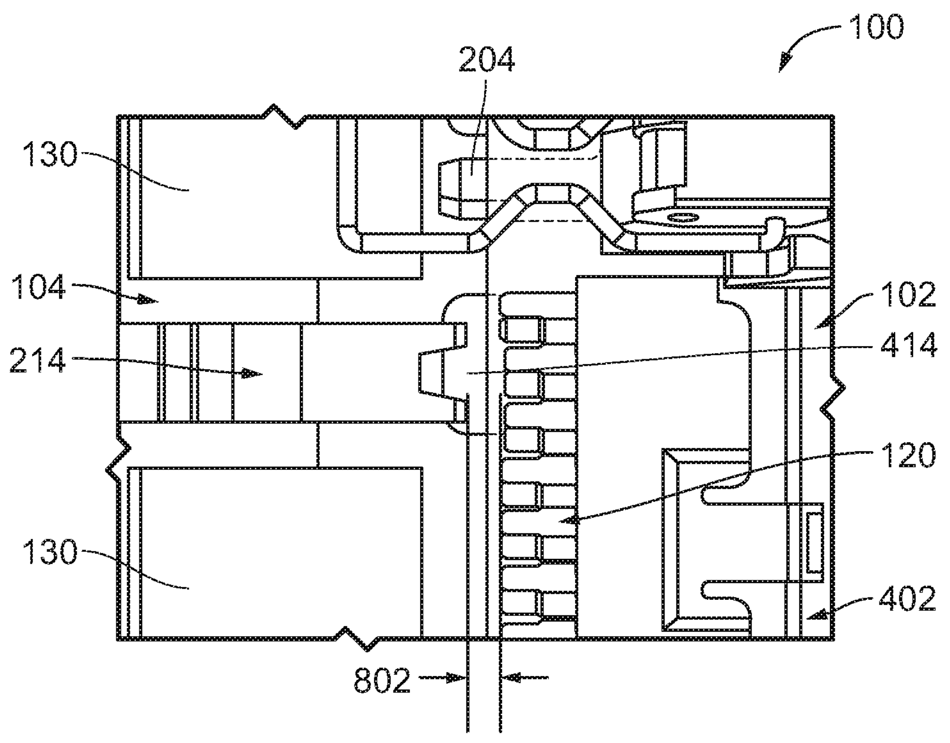
FIG. 8 is a top view of the interface between a guide socket and an embodiment of a protection cap according to at least one embodiment of the present disclosure.

FIG. 8 illustrates an interface between guide socket 214 and extension tab 414 of information handling system 100 according to at least one embodiment of the present disclosure. Information handling system 100 includes GPU node 102 and backplane 104. GPU node 102 includes alignment post 206, interface connector 120 and protection cap component 400, which in turn includes extension tab 414. Backplane 104 includes connectors 130 and guide socket 214. While FIG. 8 illustrates additional components of GPU node 102 and backplane 104, for clarity and brevity only a few of the components have been labeled and referenced with respect to FIG. 8.

As GPU node 102 is pushed closer to backplane 104, extension tab 414 and guide socket 214 may be the first components to possibly be placed in physical communication with one another. In an example, GPU plane 102 may be misaligned with backplane 104. In this example, interface connector 120 may not properly connect with connector 130. Instead, extension tab 414 may be placed in physical communication with guide socket 214. When guide socket 214 hits extension tab 414, the physical communication between the guide socket and the extension tab will prevent any portion of interface connector 120 from hitting connector 130. Additionally, when guide socket 214 hits extension tab 414, the physical communication between the guide socket and the extension tab will prevent any portion of connector 130 from hitting alignment post 206. Instead, a gap 802 of a particular distance will remain between interface connector 120 and guide socket 214.

Figure 9:
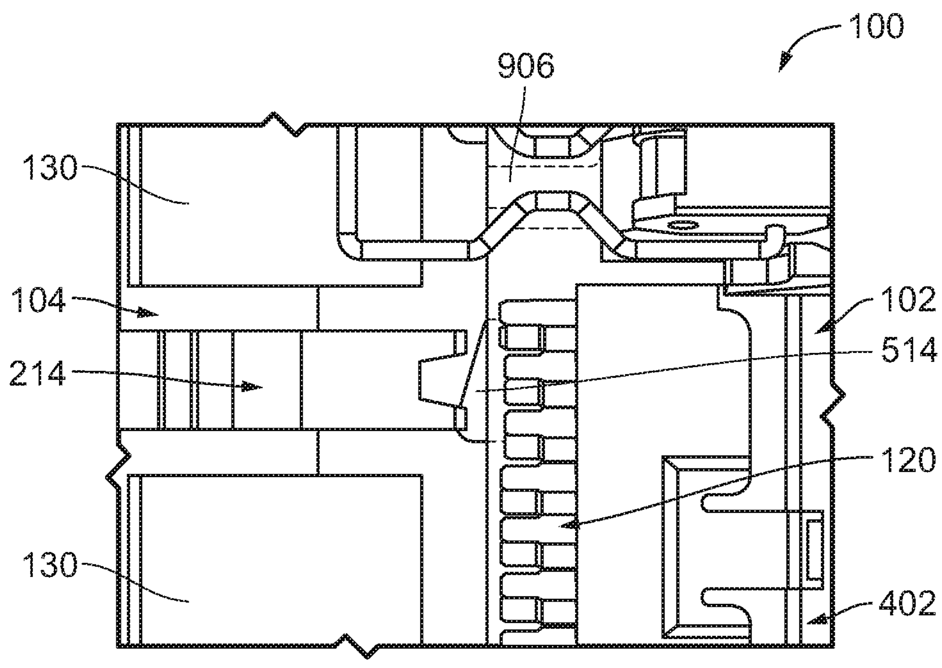
FIG. 9 is a top view of the interface between a guide socket and another embodiment of a protection cap according to at least one embodiment of the present disclosure.

FIG. 9 illustrates an interface between guide socket 214 and extension tab 514 of information handling system 100 according to at least one embodiment of the present disclosure. Information handling system 100 includes GPU node 102 and backplane 104. GPU node 102 includes alignment post 906, interface connector 120 and protection cap component 500, which in turn includes extension tab 514. Backplane 104 includes connectors 130 and guide socket 214. While FIG. 9 illustrates additional components of GPU node 102 and backplane 104, for clarity and brevity only a few of the components have been labeled and referenced with respect to FIG. 9.

As GPU node 102 is pushed closer to backplane 104, extension tab 514 and guide socket 214 may be the first components to possibly be placed in physical communication with one another. In an example, GPU plane 102 may be misaligned with backplane 104. In this example, interface connector 120 may not properly connect with connector 130. Instead, extension tab 414 may be placed in physical communication with guide socket 214. When guide socket 214 hits extension tab 514, the physical communication between the guide socket and the extension tab will prevent any portion of interface connector 120 from hitting connector 130. Additionally, when guide socket 214 hits extension tab 514, the triangular shape of the extension tab may cause guide socket to slide toward alignment post 906. In an example, the length of alignment post 906 may be such that as guide socket 214 slides along extension tab 514 until the guide socket aligns with the alignment post. In this example, the angle of extension tab 514 may provide an alignment correction between GPU node 102 and backplane 104.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A protective cap component for an information handling system, the protective cap component comprising:
- a first interface connector protective component including:
  - first and second side panels;
  - a first top panel located between top edges of the first and second side panels and extending perpendicular to the first and second side panels;
  - a first bottom panel located between bottom edges of the first and second side panels and extending perpendicular to the first and second side panels; and
  - a first extension tab in physical communication with the first bottom panel, wherein the first extension tab extends from the first bottom panel;
- a coupling component including first and second edge surfaces, wherein the first edge surface is in physical communication with the first side panel of the first interface connector protective component; and
- a second interface connector protective component including:
  - third and fourth side panels, wherein the third side panel is in physical communication with the second edge surface of the coupling component;
  - a second top panel located between top edges of the third and fourth side panels and extending perpendicular to the third and fourth side panels;
  - a second bottom panel located between bottom edges of the third and fourth side panels and extending perpendicular to the third and fourth side panels; and
  - a second extension tab in physical communication with the second bottom panel, wherein the second extension tab extends from the second bottom panel.

2. The protective cap component of claim 1, wherein the first and second extension tabs are rectangular.

3. The protective cap component of claim 1, wherein the first and second extension tabs are triangular.

4. The protective cap component of claim 3, wherein a first edge of the first extension tab tapers downward toward the coupling component, and a second edge of the second extension tab tapers downward toward the coupling component.

5. The protective cap component of claim 1, wherein the first interface connector protective component further includes a plurality of snap lock components to snap fit over an interface connector of the information handling system.

6. The protective cap component of claim 1, wherein the second interface connector protective component further includes a plurality of snap lock components to snap fit over an interface connector of the information handling system.

7. An information handling system comprising:

first and second interface connectors to provide electrical communication to the information handling system; and a protective cap component including:

a first interface connector protective component in physical communication with the first interface connector, the first interface connector protective component including:

a first extension tab extending from a first bottom panel of the first interface connector protective component;

a coupling component in physical communication with a side panel of the first interface connector protective component; and a second interface connector protective component in physical communication with the second interface connector, the second interface connector protective component including a second extension tab extending from a second bottom panel of the second interface connector protective component.

8. The information handling system of claim 7, further comprising an alignment post, wherein the alignment post extends through the coupling component of the protective cap component.

9. The information handling system of claim 7, wherein the first and second extension tabs are rectangular in shape.

10. The information handling system of claim 7, wherein the first and second extension tabs are triangular in shape.

11. The information handling system of claim 10, wherein a first edge of the first extension tab tapers downward toward the coupling component, and a second edge of the second extension tab tapers downward toward the coupling component.

12. The information handling system of claim 7, wherein the first interface connector protective component further includes: a plurality of snap lock components to snap fit over the first interface connector of the information handling system.

13. The information handling system of claim 7, wherein the second interface connector protective component further includes: a plurality of snap lock components to snap fit over the second interface connector of the information handling system.

14. An information handling system comprising:

first and second interface connectors to provide electrical communication to the information handling system; and a protective cap component including:

a first interface connector protective component in physical communication with the first interface connector, the first interface connector protective component including:

first and second side panels;

a first top panel located between top edges of the first and second side panels and extending perpendicular to the first and second side panels;

a first bottom panel located between bottom edges of the first and second side panels and extending perpendicular to the first and second side panels; and a first extension tab in physical communication with the first bottom panel, wherein the first extension tab extends from the first bottom panel;

a coupling component including first and second edge surfaces, wherein the first edge surface is in physical communication with the first side panel of the first interface connector protective component; and a second interface connector protective component in physical communication with the second interface connector, the second interface connector protective component including:

third and fourth side panels, wherein the third side panel is in physical communication with the second edge surface of the coupling component;

a second top panel located between top edges of the third and fourth side panels and extending perpendicular to the third and fourth side panels;

a second bottom panel located between bottom edges of the third and fourth side panels and extending perpendicular to the third and fourth side panels; and a second extension tab in physical communication with the second bottom panel, wherein the second extension tab extends from the second bottom panel.

15. The information handling system of claim 14, further comprising an alignment post that extends through the coupling component of the protective cap component.

16. The information handling system of claim 14, wherein the first and second extension tabs are rectangular in shape.

17. The information handling system of claim 14, wherein the first and second extension tabs are triangular in shape.

18. The information handling system of claim 17, wherein a first edge of the first extension tab tapers downward toward the coupling component, and a second edge of the second extension tab tapers downward toward the coupling component.

19. The information handling system of claim 14, wherein the first interface connector protective component further includes: a plurality of snap lock components to snap fit over the first interface connector of the information handling system.

20. The information handling system of claim 14, wherein the second interface connector protective component further includes: a plurality of snap lock components to snap fit over the second interface connector of the information handling system.

* * * * *